INVENTOR.
BY R Sidney Segsworth

J. H. SLOUGH
ATTORNEY

INVENTOR.
BY R. Sidney Segsworth

J. H. SLOUGH
ATTORNEY

INVENTOR.
BY R. Sidney Segsworth

J. H. SLOUGH
ATTORNEY

INVENTOR.
BY R. Sidney Segsworth
J. H. SLOUGH
ATTORNEY

United States Patent Office 3,436,642

Patented Apr. 1, 1969

3,436,642

POLYPHASE TO SINGLE PHASE STATIC FREQUENCY MULTIPLIERS WITH SWITCHING DEVICES RESPONSIVE TO LOAD CONDITIONS

Robert Sidney Segsworth, Warren, Ohio, assignor to Ajax Magnethermic Corporation, Warren, Ohio, a corporation of Ohio Filed Sept. 1, 1966, Ser. No. 576,596
Int. Cl. H02m 5/04, 5/30
U.S. Cl. 321—7 13 Claims

ABSTRACT OF THE DISCLOSURE

Static frequency multiplier supplied by a source of polyphase power and supplying a variable single phase load. Control circuitry for the multiplier including solid state switching devices which are operated independently of the supply voltage but are responsive to load conditions.

This invention relates to control means for static frequency multipliers and relates more particularly to control means for static frequency multipliers of the type which are adapted to produce A.C. single phase power from a multiphase A.C. source.

In prior art multipliers with which I am familiar as U.S. Letters Patent No. 3,040,230 and No. 3,040,231 of Paul P. Biringer, assignor by mesne assignment to Ajax Magnethermic Corporation, assignee of the present application, a power supply system converts power from a multiphase A.C. source of fixed frequency utilizing a plurality of chokes, capacitors and non-linear transformer devices in such systems. In said multipliers, the output frequency bears a simple whole number ratio to the frequency of the source, e.g., 60/180, 60/540, etc. bearing a constant frequency relation to the supply voltage.

At present, conventional system use switching capacitors and taps on a coupling transformer to adjust for load changes when the static frequency devices such as the above referred to Biringer multiplier is used with loads such as melting furnaces.

The present invention is particularly adapted for use as a static frequency multiplier for use in melting furnaces, where a variable output frequency is required and/or for use with variable speed motors, etc. and, as shown, dispenses with the use of capacitor switches, tap changers and similar moving parts or devices, accomplishing its load match by varying the output frequency by use of solid state switching devices in the power supply unit; such devices being controlled to achieve the desired control by continuously varying the output power or frequency or both under load conditions either manually or automatically.

The system according to my present invention may be termed, in contrast to multipliers of the "synchronous" type, "non-synchronous," the output voltage bearing a variable frequency relation to the supply voltage.

The present invention contemplates the use of solid state switching devices in a polyphase supply system having a fixed frequency, and control means for regulating the same, whereby alternating current delivered from the polyphase source is delivered to a single phase load, such as a melting furnace, at an alternating current of higher frequency going directly from the A.C. multiphase source to the single phase A.C. output of higher frequency, the output alternating current frequency being adapted to be varied. The invention further contemplates the use of control means to actuate the solid state switching devices in the power circuit when the power which the solid state switching devices control is in its optimum phase relationship.

In the present invention, by using solid state switching devices to perform the switching action and through the application of the novel control means disclosed herein, pulses of desired amplitude and duration may be supplied to the solid state switching devices in the power circuit and the timing of these pulses controlled to achieve a predetermined desired result.

A principal object of this invention is to obtain, in multipliers of the type related, a variable frequency output.

It is an object of this invention to provide improved means for providing a single phase higher frequency output from a multiphase source of lower frequency where the output frequency can be varied as desired.

A further object of this invention is to provide improved means for providing single phase higher frequency output from a multiphase source of fixed lower frequency where the output frequency can be varied as desired without the necessity of intermediate D.C. means.

A further object of this invention is to provide improved means for providing single phase higher frequency output from a multiphase source of fixed lower frequency where the output frequency can be varied as desired without the use of capacitor switches, tap changers and similar moving parts.

It is a further object of my invention to provide a static frequency multiplier wherein multiphase A.C. power is converted to a single phase A.C. power and a balanced load provided on the multiphase circuit; the phases being balanced symmetrically.

A further object of my invention is to provide, in a static frequency multiplier of the type described, means whereby a stepless control of the output power from zero to the maximum under load is obtained.

It is another object of my invention to provide, in a static frequency multiplier of the type described, control means which are not necessarily synchronized with the frequency of the multiphase power source to operate solid state switching devices at desired time intervals having a desired amplitude and duration of the pulses.

It is a further object of my invention to provide in a static frequency multiplier of the type described, control means whereby the switching devices are actuated when the phase relationship of the power is at the optimum.

It is a further object of this invention to provide, in a static frequency multiplier of the type described, control means for regulating the time during which power is supplied from any one phase and so control from zero to maximum the energy delivered to the output circuit.

A still further object of this invention is to provide control means for regulating solid state switching devices in static frequency multiplier devices of this invention by means whereby the devices can be made to match the characteristics of the load.

A further objective of my invention is to determine, in a static frequency multiplier of the type described, when the current from the solid state switching devices ceases to flow for particular purposes to be described later herein, interposing a delay between the actions of one solid state switching device and another.

Another object of my invention is to provide control means for multipliers of the type recited wherein the control means is simple, instantaneous and efficient in operation, and whereby a more efficient use of the power supplied to the load is achieved and resultant economies in operation result.

Other objects of the invention and the invention itself will become more readily apparent by reference to the appended specification and claims and accompanying drawings, in which drawings:

Figure 3:
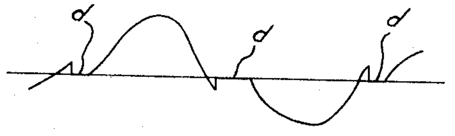
FIGURE 3 is a diagrammatic view of the form of alternating current taken at a point in the circuit of FIGURE 1, designated at "X," interposed in the circuit between the solid state switching devices and the load.
Figure 4:
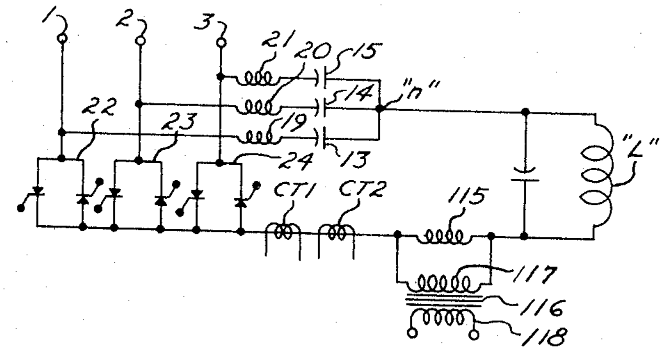
FIGURE 4 is a circuit diagram of an alternate basic power circuit adapted to be employed with the circuits of FIGURES 6 and 8.
Figure 7:
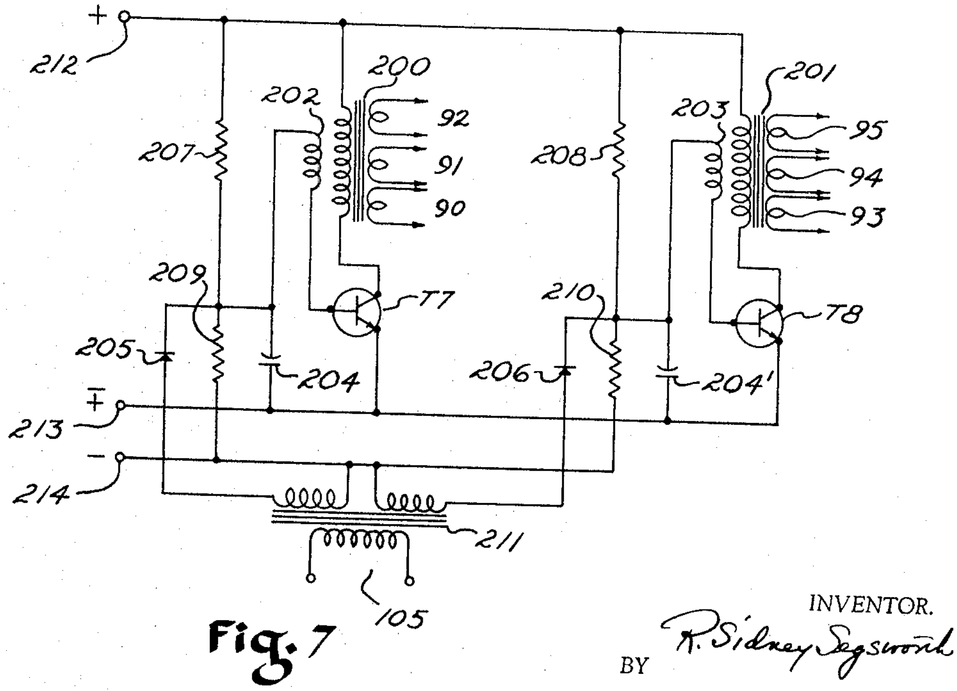
Figure 8:
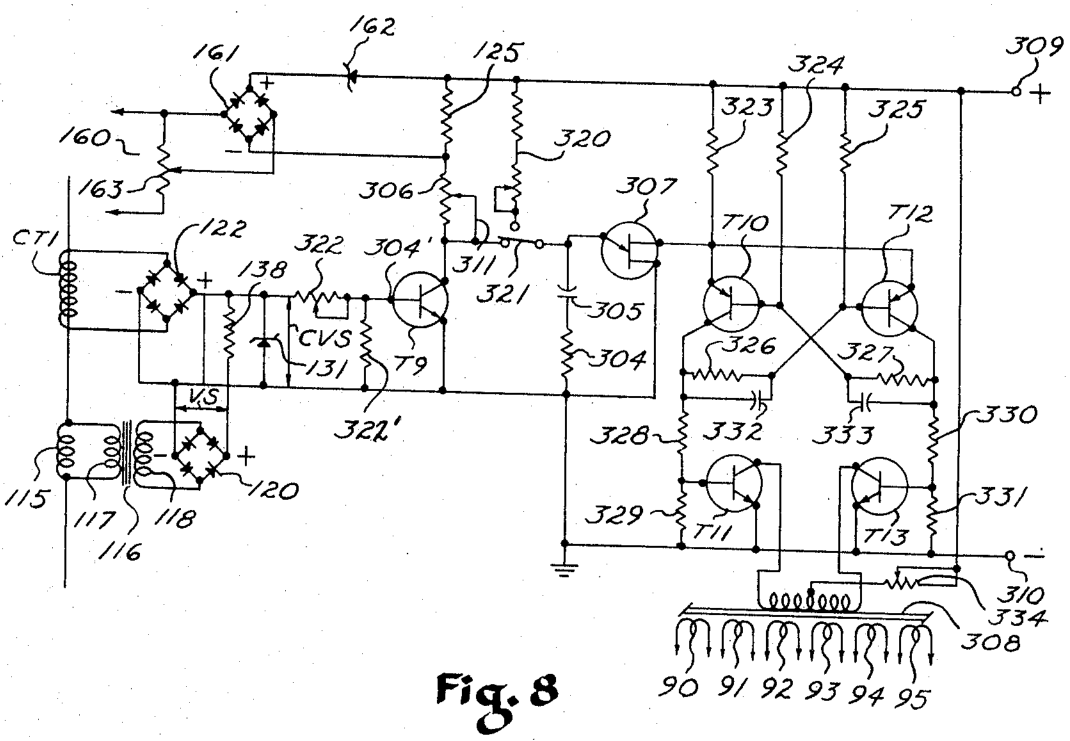
Figure 9:
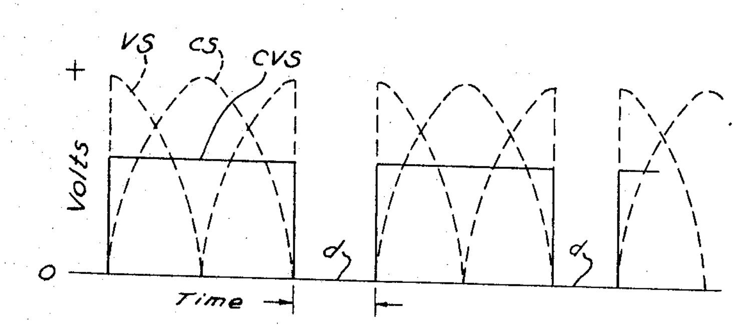

FIGURE 7 discloses an alternative control circuit in which the timing is controlled by an external signal;

FIGURE 8 is a circuit diagram illustrating another modification of the control means incorporating improvements suitable for use with units having large power requirements;

FIGURE 9 is a diagrammatic view of voltage and current waves across the reactor of FIGURE 4, square waves being generated by the circuit as shown and illustrated further, a variable delay in response to a signal, wherefor the output power can be controlled over a range of zero to maximum, as shown in FIGURE 3.

Figure 1:
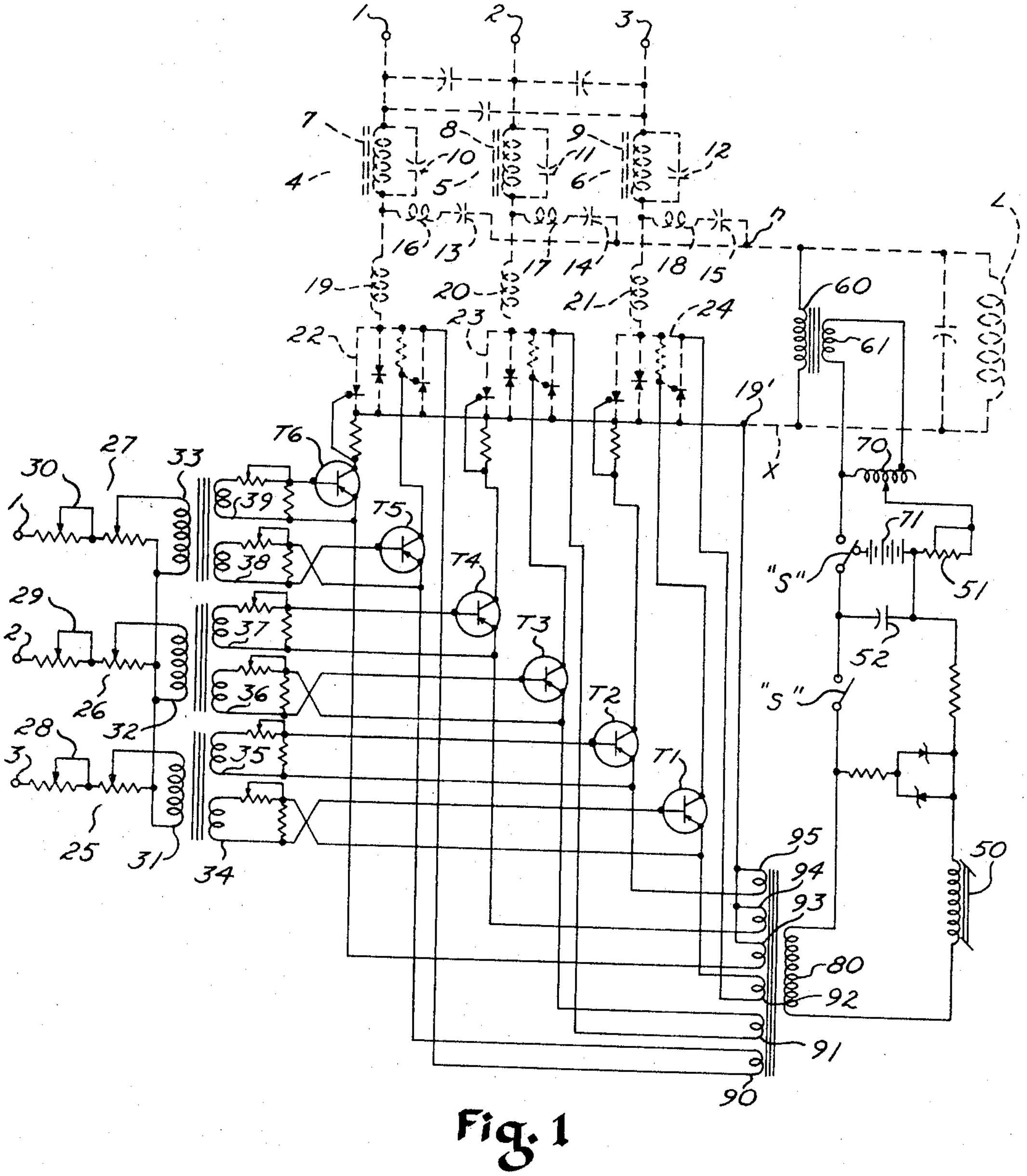
FIGURE 1 is a circuit diagram of a basic circuit for static frequency multipliers disclosing a preferred form of my invention, in which a number of solid state switching devices are used; the timing of the pulses being controlled by a voltage signal taken from the output circuit.

Referring now to the drawings, in all of which like parts are designated by like reference characters, in FIGURE 1 the polyphase supply circuit used in my invention is shown in dotted lines, the same being similar to that shown in FIGURE 3 in copending application Ser. No. 519,601 filed Jan. 10, 1966, assigned to assignee of the present application, employing reactors 4, 5, and 6 in each phase of the supply consisting of chokes 7, 8 and 9, respectively, with capacitance 10, 11, 12, respectively, in parallel therewith; capacitors 13, 14, 15 are connected phase to phase in the supply circuit carrying fundamental and all odd harmonic components of the supply voltage, creating an artificial neutral; linear reactors 16, 17, 18 are further shown which may be tuned to fifth or seventh harmonic series resonance to achieve improvement in the input power factor. As shown in the figure of said related application, linear reactors 19, 20, 21 are interposed in each phase between the series capacitors 13, 14, 15 and the solid state switching devices 22, 23, 24 and said solid state switching devices are interposed in each phase between the load L and the artificial neutral created by reactors 19, 20, 21 indicated at *n*. The devices 22, 23, 24, are shown as silicon controlled rectifiers disposed back to back. The load L which is a high frequency load, such as a melting furnace, is shown connected across the common point 19' of the solid state switching devices and the star point or neutral *n* of the star connected capacitors in the supply circuit.

It will be noted that the linear reactors 19, 20, 21 are disposed in series in each supply line between the supply points 1, 2 and 3 and the said silicon controlled rectifiers 22, 23, 24 and operate as described and shown in the said related application. The system in said application is a synchronous system and the output voltage bears a constant frequency relation to the supply voltage similarly to the static frequency multiplier of U.S. Patent No. 3,040,230 referred to hereinbefore.

In the present invention as shown in the figures of drawing herein, control means are provided for going from a polyphase input supply of alternating current of a fixed frequency to alternating current of a higher and varied frequency at the output. The control means include in the form of FIGURE 1 herein means for timing the pulses by a voltage signal taken from the output circuit; means for adjusting the voltage ratio between the output circuit and control circuit; means for adjusting the phase relation of the firing pulse with respect to the phase of the voltage in the output circuit. A plurality of voltage control devices 25, 26, 27 are interposed in each of the supply lines and, in the firing circuit illustrated, consist of adjustable resistor devices 28, 29, 30 coupled with transformers 31, 32, 33, respectively. A pair of secondary windings 34–35, 36–37, 38–39, are magnetically coupled with each of the primary windings of the voltage transformers 31, 32, 33 and the three phase voltage derived therefrom is applied to the base of transistors T1, T2, T3, T4, T5, T6 to selectively switch pulses and to permit the pulses to fire the solid state switching devices, i.e., silicon control rectifiers shown at 22, 23 and 24. Ignitrons, thyratrons and other similar magnetic devices may be employed rather than silicon control rectifiers to selectively achieve a desired single phase alternating output circuit frequency across the load as shown at L. By varying the voltage applied, as described, the transistors T1, T2, T3, T4, T5 and T6 may be rendered conducting or nonconducting and can thus direct pulses to the silicon controlled rectifiers in the selected phases to control their operation and thus regulate the output power; power from each phase of the supply being drawn for any portion of the available time desired. The signal circuit connected through the potential transformer 60 to the load circuit and shown in the figure at the right includes further control means for improved pulse shaping and phase shifting, a reactor 50 is employed for forming the pulse and the phase shifting network employs a resistor 51 in parallel with the capacitor 52 in a manner which will be apparent to those skilled in the art.

A double-pole, double-throw switch S—S is shown which is adapted to actuate the phase shifting and pulse shaping network. The phase shifting network picks up a signal from a secondary 61 of the potential transformer 60 in the output circuit, delivers said signal to a variable ratio transformer 70 which provides for adjustment of the voltage ratio between the output and control circuit.

The said signal is delivered to the primary 80 of a transformer magnetically coupled to secondary windings 90, 91, 92, 93, 94 and 95 in the control circuit connected to the emitters of the separate transistors shown at T1, T2, T3, T4, T5 and T6, whereby the pulses are directed to the appropriate silicon control rectifiers.

The double-throw switch S—S is provided to turn the control circuit "on" or "off" as desired and a separate D.C. power source such as the battery 71, through operation of the same switch, is arranged to charge a capacitor 52 when the switch is off. When the switch is moved to "on" position, the capacitor 52 is discharged through the circuit to provide the initial firing pulse to put the circuit into operation. In this circuit a so-called "envelope control" is disclosed which consists of a three phase voltage supply connected to a main three phase power supply, as has been described, through appropriate transformer and voltage control devices; the voltage being applied to the base of the transistors in the firing control for each solid state switching device as indicated.

By varying the voltage applied as shown at 25, 26, 27 the transistors are rendered conducting or nonconducting as desired and thus pulses are supplied by such transistors to the silicon control rectifiers in the selected phases to control the operation thereof and regulate the output power.

Figure 2:
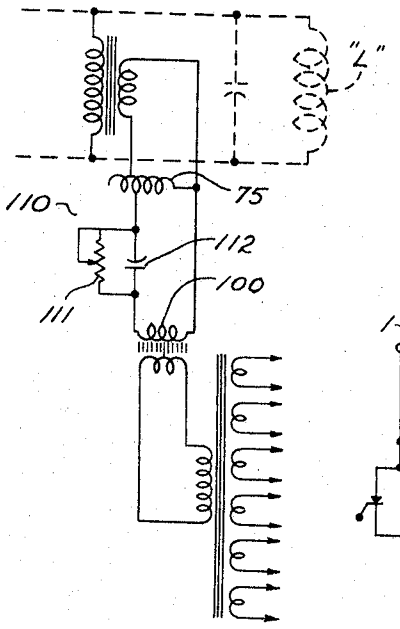
FIGURE 2 is a circuit diagram showing an alternate arrangement of phase shifting and pulse shaping for that shown in FIGURE 1.

In FIGURE 2 as stated, an alternative arrangement for using the voltage signal obtained from the output circuit to establish the timing of the pulses delivered to the firing circuit in the silicon controlled rectifiers as illustrated. In this circuit a saturating transformer 100 rather than a series connected saturated reactor, as shown at 50 in FIGURE 1, is used for the pulse forming; the phase shifting network 110 further employs a resistor 111 in parallel with the capacitor 112 rather than a resistor in series therewith as shown at 51, 52 in FIGURE 1.

FIGURE 3 shows the form of alternating current in the connection X shown in FIGURE 1 between the silicon control rectifier units 22, 23, 24 disclosed in that figure and the load. It will be noted from the said illustration that by the control means of the invention a delay period *d* is provided between the operation of the alternately employed switching devices.

FIGURE 4 illustrates a basic power circuit in which the control circuit includes a pair of current transformers CT1, CT2 for obtaining signals from the load current as discussed hereinafter in connection with FIGURES 6, 8 and 9. A reactor 115 is provided in the load circuit and the primary 117 of a transformer 116 is connected to each end of the reactor 115 to provide a voltage signal from the secondary 118 corresponding to the voltage drop across the reactor 115.

Figure 5:
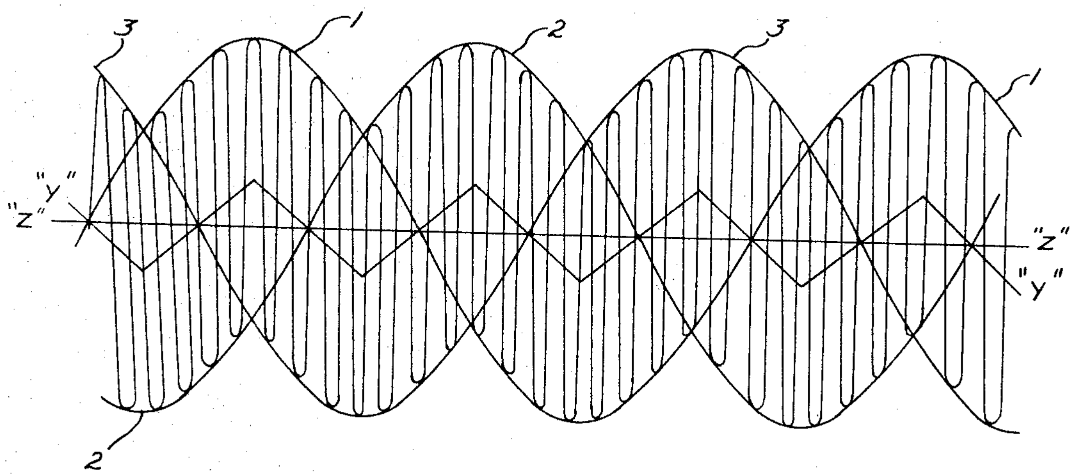
FIGURE 5 is a diagrammatic view showing the relationship between the voltage in the three phase power input and the relatively high frequency single phase output.

FIGURE 5 shows the relationship in the basic circuitry of this invention between the three phase power input 1, 2 and 3 and the higher frequency single phase output indicated at X. It will be observed that the neutral axis of the high frequency output designated as *y—y* is not parallel to the neutral axis of the three phase input indicated at *z—z*, but oscillates about this axis at a frequency three times the supply frequency. However, despite the fact that rectification is not used, as illustrated in FIGURE 4, the peak to peak amplitude of the relatively higher output frequency shows little variation. This figure discloses clearly in what manner the output must be connected in sequence to the proper input phase and, if this is done, any desired single phase output frequency may be achieved which is within the limits of the operation of the solid state switching devices employed.

Figure 6:
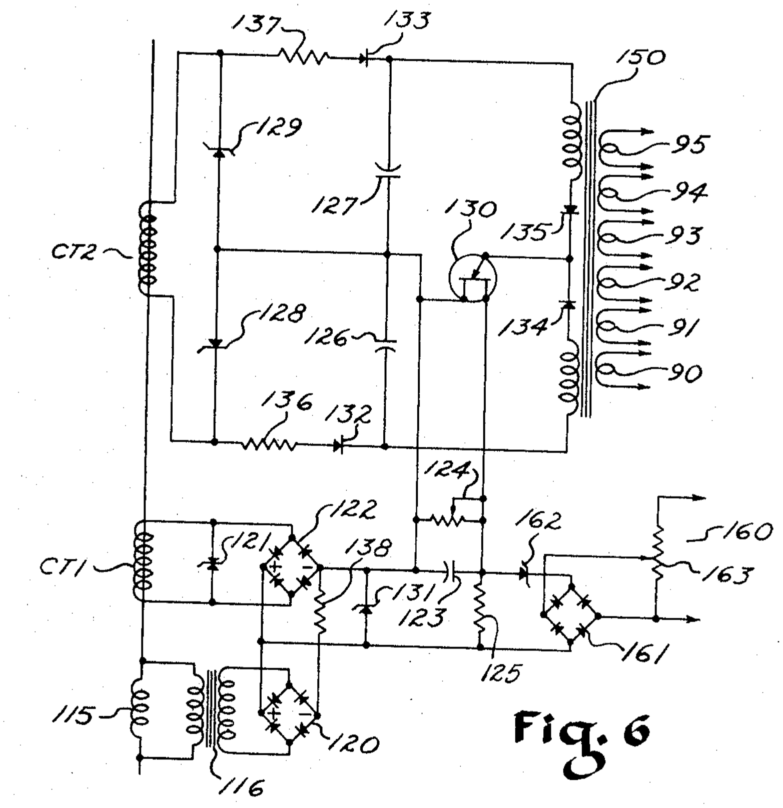
FIGURE 6 is a simple control circuit in which the timing is established by the resonant frequency of the load current.

FIGURE 6 shows a simple control circuit which can be employed in the basic circuit of FIGS. 1 and 4, but wherein the timing of the pulse is established by the resonance of the load circuit and means are provided to ensure that no two solid state switching devices in opposing phases may be turned on simultaneously.

In this circuit, two current transformers CT1, CT2, and reactor 115 and transformer 116 are used to provide current and voltage signals from the load circuit as described above and shown in FIGURE 4. The current signal from CT1 and voltage signal from 116 are rectified by rectifiers 120 and 122 and combined across resistor 138 and, as indicated in FIGURE 9, deliver a signal which has a very sharp rise, continuing substantially constant so long as current is flowing and dropping sharply when the current stops; the combined signal secured is applied in this form of my invention across a storage capacitor 123, as indicated.

An adjustable resistance 124 which can be adjusted to predetermine the duration of a delay in pulsing is connected across the storage capacitor 123 so that, when the signal stops, the voltage on the capacitor 123 decays at a rate controlled by the resistance 124. A Zener diode 121 is connected across CT1 to limit the voltage applied to rectifier 122. A Zener diode 131 is connected across the storage capacitor circuit to establish an upper limit of the voltage applied to the said capacitor 123. The signal from the second current transformer CT2 is rectified by diodes 132, 133 and applied across either of two capacitors 126, 127 depending upon the direction in which the current is flowing. The maximum value of the voltage level is controlled by Zener diodes 128, 129. The voltage so obtained is connected through a transformer 150 and across a unijunction transistor 130 in the conventional manner. Diodes 134 and 135 operate to permit the flow of current from the capacitors 126, 127 in the desired direction through the transistor 130 and to prevent the discharge thereof through other parts of the circuit.

It will be observed that resistors 136, 137 are interposed in the charging circuits for the capacitors 126, 127 so that the voltage will rise on these capacitors at a rate slower than that established for the storage capacitor 123 which ensures that the unijunction transistor 130 remains in a non-conductive position until the timing circuit has operated and voltage on the storage or timing capacitor 123 has decayed to the operative level.

With this arrangement, as long as current is flowing in the load circuit, the unijunction transistor remains nonconductive. As soon as the current stops flowing, the voltage on the storage capacitor 123 begins to fall at a rate established by the delay control 124 until at a predetermined point, the unijunction transistor 130 will become conductive permitting a sharp pulse to flow through the proper winding on the transformer 150, which is picked up by secondary windings 90, 91, 92, 93, 94 and 95 and applied to the appropriate firing circuit in the solid state switching devices of FIGURE 1.

It will be appreciated that the above delay control means may be employed either with or without the "envelope control" discussed above.

A further improvement in the circuit of FIGURE 6 involves the use of means to provide automatic control on the basis of an external voltage signal indicated at 160, the said signal may be related to the volts, current, power, temperature, etc. This signal is rectified as indicated at 161 and applied across the resistor 125 in the delay capacitor circuit so that the delays may be decreased or increased in proportion to such signals. A Zener diode 162 may be employed to provide a constant reference level above which external voltage signal is effective.

FIGURE 7 illustrates an alternative method for supplying pulses to the main switching devices in which the timing is controlled by an exterior signal. In this case two output transformers 200 and 201 are used in the signal circuit in place of the single transformer as illustrated at 150 in FIGURE 6 to provide alternate pulses in the opposite sense to the switching devices. DC power to operate this circuit is provided with the polarity as shown at points 212, 213 and 214. Resistors 207 and 209, 208 and 210 are connected as potentiometers across the DC supply to provide a suitable bias for the base of transistors T7 and T8. This bias is adjusted to maintain these transistors in the nonconducting stage. With this arrangement, when the signal is applied at 105, the transformer 211 delivers a positive signal through diodes 205 and 206 and applied across the capacitors 204 or 204' depending upon the sense of the signal to the base of transistor T7 or T8 causing the appropriate transistor to become conductive. As soon as this happens, a potential is developed in the regenerative winding 202 or 203 which further increases the positive signal applied to the base or transistor involved. This causes a very rapid rise in the current which continues until the transformer 200 or 201 is saturated. When this happens, the electromotive force created in the regenerative winding 202 or 203 is reversed giving a very sharp cutoff. By appropriate design of the transformers 200 and 201 and the control network, the width and heighth of the output pulse may be established at any desired value to suit the requirements of appropriate switching devices. It is also to be understood that the circuit of this figure could also utilize the envelope control of FIGURE 1 or not as is desired and/or also the zero sensing control described in connection with FIGURE 6.

FIGURE 8 illustrates the control circuit to accomplish the results achieved by the circuit of FIGURE 6 and incorporating some additional improvements suitable for use with units having large power requirements. In the circuit of FIGURE 8, timing may be established by the characteristics of the load circuit or may be adjusted independently. This circuit also includes flip-flop switching and output amplification to permit delivering much larger signals then could be obtained from the simple circuitry illustrated in FIGURE 6. The circuit of FIGURE 8 employs the current and voltage sensing circuit of FIGURE 6 and this is similarly employed through a feedback arrangement to control automatically the delay between subsequent firing pulses. Elements in this circuit having similar functions carry the same numbers as elements shown in FIGURE 6. Rectified current and voltage signals from the load circuit are combined across the resistor 138 and the combined signal is applied to the base 304' of the transistor T9. DC power to operate the output section of the circuit of FIGURE 8 is applied with the polarity as shown at 309 and 310. An adjustable resistance 322 and fixed resistance 322' providing means to adjust the level of the signal applied to the base of the transistor T9. A switch 321 is provided so that the capacitor 305 in the emitter circuit of the unijunction transistor 307 may be charged either through the adjustable resistance network 320 or alternatively through the resistance network 306 which comprises resistor 125 in the feedback network described above and adjustable resistor 311. It will be apparent that when the connection is made to employ the network 320 that the timing of the firing circuit is established by the relative characteristics of this network and the capacitor 305 only. Alternatively, in the other position of the switch 321 timing is limited and controlled by both the feedback and delay circuits as described previously. Resistor 304 in the emitter circuit limits the current in that circuit to safe values. Transistors T10 and T12 with their attendant resistors 323 to 331 inclusive, and capacitor network 332, 333 form a flip-flop circuit which is operated by unijunction transistor 307 in a manner which will be familiar to those skilled in the art. Transistors T11 and T13 are provided to create pulses of appropriate magnitude to operate the switching devices. Adjustable resistor 334 is used to control the current in the output transformer 308.

FIGURE 9 illustrates the type of signal employed as indicated in both FIGURE 6 and FIGURE 8 to operate the pulse delay portion of the controlled circuit. DC potential CS is obtained at the output of rectifier 122 as indicated at the points marked in FIGURE 8. Similarly DC potential VS is obtained at output of rectifier 120 and is proportional to the voltage appearing across reactor 115 in the load circuit. These two potentials are applied in parallel across the Zener diode 131 to give a DC potential signal generally of the form indicated at CVS which signal appears as indicated at the points marked on FIGURE 8. It will be apparent that this signal CVS in a square wave having characteristics of a very sharp rise at the instant current starts to flow to the potential established by Zener diode 131 which is maintained so long as current is flowing and which drops as soon as current stops. Further, the effect of the delay is indicated by the gap marked *d* which, as explained above, is controllable in response to the circuits discussed.

From the above, it will be noted that the various forms and modifications herein illustrated disclose basically three forms of control which may be used either singly or in combination to provide infinitely variable output power from zero to maximum and such circuitry can be operated automatically or manually and without interruption of the power supply. The forms of control disclosed are (1) "envelope control" whereby by simply varying the voltage applied to the base of the transistors, as in FIGURE 1, it is possible to draw power from each phase of the supply circuit for any portion of the available time desired; (2) "controlled delay" whereby the firing pulse is delayed as desired for any period after the current from the silicon control rectifier units has stopped, whereupon by increasing the delay the energy delivered to the load is reduced, thus making it possible to control from zero to maximum the energy delivered from the output circuit, as shown in FIGURES 6 and 8; and (3) "frequency control" whereby the output frequency may be varied at will and the energy delivered to the load will increase with rising frequency and decrease with falling frequency, as illustrated in the circuits herein; wherefore, the frequency in a unit, such as a unit supplying power to an induction heating and melting installation can be adjusted to compensate for variations in the load power factor and thus maintain optimum conditions without switching capacitors.

I claim:

1. Control means for static frequency multipliers comprising a source of polyphase power and a variable single phase load, said control means comprising solid state switching devices, means for delivering alternating current power at a higher frequency than source frequency to the single phase load, said solid state switching devices being interposed between the source and the load, means operably connected between the solid state switching devices which are switched independently of the supply voltage and the load causing selective switching of the said solid state switching devices in response to load conditions to regulate output power.

2. Control means for static frequency multipliers as claimed in claim 1, said control means including means for balancing the phases symmetrically.

3. Control means for static frequency multipliers as claimed in claim 1, wherein the output frequency is established by the resonance of the load circuit.

4. Control means for static frequency multipliers as claimed in claim 1, means controlling the amplitude and phase relationship of the pulses of the solid state switching devices.

5. Control means for static frequency multipliers as claimed in claim 1, said control means actuating said solid state switching devices during any selected period from any selected phase of the supply to regulate the output power from zero to maximum under load.

6. Control means for static frequency multipliers as claimed in claim 1, wherein the said output alternating current of higher frequency is variable, sensing means sensing when the current from the solid state switching devices ceases to flow.

7. Control means for static frequency multipliers as claimed in claim 6, comprising means interposing a delay between the action of one solid state switching device and another.

8. Control means for static frequency multipliers as claimed in claim 1, including means for timing the pulses of said solid state switching devices by a voltage signal from the output circuit, means for adjusting the voltage signal from the output circuit, means for adjusting the voltage ratio between the output and the control means and means for adjusting the phase relation of the firing pulse with respect to the phase of the voltage in the output circuit.

9. Control means for static frequency multipliers having a polyphase supply circuit, capacitors connected phase-to-phase in the said supply circuit carrying fundamental and all odd harmonic components of the supply voltage creating an artificial neutral, linear reactors in series with said capacitors tuned to fifth or seventh harmonic series resonance, solid state switching devices in each phase delivering to a single phase load an alternating current of variable higher frequency than said supply frequency, said solid state switching devices being interposed between the said load and said artificial neutral, the load being connected across a common point of the solid state switching devices and the neutral of said capacitors, said control circuit including a plurality of voltage control devices interposed in each of the phases to actuate the solid state switching devices to regulate the output power, a transformer in the output load circuit, a signal circuit connected through said transformer to the load circuit including pulse shaping and phase shifting means, a variable ratio transformer in said signal circuit providing adjustment of the voltage ratio between the output and control circuits to regulate the output power, said control circuit being responsive to the voltage and current in the load circuit.

10. Control means for static frequency multipliers, a polyphase supply circuit, capacitors connected phase-to-phase in the supply circuit carrying fundamental and all odd harmonic components of the supply voltage creating an artificial neutral, linear reactors in series with said capacitors, solid state switching devices in each phase, a single phase load of higher frequency than said supply frequency, said solid state switching devices being interposed between the said load and said artificial neutral, the load being connected across a common point of the solid state switching devices and the neutral of said capacitors, said control circuit including a plurality of voltage control devices interposed in each of the phases to actuate the solid state switching devices to regulate the output power, means providing current and voltage signals from the load circuit, means for combining said current and voltage signals controlling the pulse shaping and phase shifting of the solid state switching devices connected thereto to regulate the output power, said control circuit being responsive to voltage and current in the load circuit.

11. Control means for static frequency multipliers, a polyphase circuit, capacitors connected phase-to-phase in the supply circuit carrying fundamental and all odd harmonic components of the supply voltage creating an artificial neutral, linear reactors in series with said capacitors tuned to fifth or seventh harmonic series resonance, solid state switching devices in each phase, a single phase load of higher frequency than said supply frequency, said solid state switching devices being interposed between the said load and said artificial neutral, the load being connected across a common point of the solid state switching devices and the neutral of said capacitors, said control circuit including a plurality of voltage control devices interposed in each of the phases to actuate the solid state switching devices to regulate the output power, means providing current and voltage signals from the load circuit, means combining said current and voltage signals to control pulse shaping and phase shifting and timing of the solid state switching devices connected thereto to regulate the output power in response to change in load characteristics, a delay period being provided between the operation of alternately employed switching devices.

12. Control means for static frequency multipliers as claimed in claim 10, timing of the pulses of the solid state switching devices being established by the resonance of the load circuit, means preventing said solid state switching devices in opposing phases from operating simultaneously.

13. Control means for static frequency multipliers as claimed in claim 12, the combined signals being applied across storage means, adjustable means controlling the delay of voltage on the said storage means wherefor pulsing of the switching devices is delayed for a selected period after current from the load circuit has ceased flowing.

References Cited

UNITED STATES PATENTS

| | | | |
|---|---|---|---|
| 3,040,230 | 6/1962 | Biringer | 321—7 |
| 3,054,940 | 9/1962 | Chirgwin et al. | 321—69 |
| 3,099,784 | 7/1963 | Forsha et al. | 321—7 |
| 3,270,270 | 8/1966 | Yenisey | 321—18 |
| 3,295,045 | 12/1966 | Domizi | 321—7 |
| 3,302,093 | 1/1967 | Yarrow | 321—7 |
| 3,315,143 | 4/1967 | Lawrence et al. | 321—7 |
| 3,337,788 | 8/1967 | Pelly | 321—7 |
| 3,332,008 | 7/1967 | Mueller et al. | 321—16 X |

JOHN F. COUCH, *Primary Examiner.*

G. GOLDBERG, *Assistant Examiner.*

U.S. Cl. X. R.

307—240, 269; 321—61, 69